(12) United States Patent
Williams

(10) Patent No.: US 12,167,582 B2
(45) Date of Patent: Dec. 10, 2024

(54) SHIELDED INTERCONNECT SYSTEM

(71) Applicant: GITech, Inc., Austin, TX (US)

(72) Inventor: John Williams, Austin, TX (US)

(73) Assignee: GITech, Inc., Austin, TX (US)

( * ) Notice: Subject to any disclaimer, the term of this patent is extended or adjusted under 35 U.S.C. 154(b) by 651 days.

(21) Appl. No.: 17/372,233

(22) Filed: Jul. 9, 2021

(65) Prior Publication Data

US 2022/0022348 A1  Jan. 20, 2022

Related U.S. Application Data

(60) Provisional application No. 63/052,416, filed on Jul. 15, 2020.

(51) Int. Cl.
| | |
|---|---|
| *H05K 9/00* | (2006.01) |
| *G01R 31/28* | (2006.01) |
| *H01L 23/00* | (2006.01) |
| *H01L 23/498* | (2006.01) |
| *H05K 1/02* | (2006.01) |
| *H05K 1/14* | (2006.01) |

(52) U.S. Cl.
CPC ....... *H05K 9/0035* (2013.01); *G01R 31/2884* (2013.01); *H01L 23/49816* (2013.01); *H01L 24/16* (2013.01); *H05K 1/0268* (2013.01); *H05K 1/144* (2013.01); *G01R 31/2896* (2013.01); *H01L 2224/16225* (2013.01); *H05K 2201/10234* (2013.01); *H05K 2201/2018* (2013.01)

(58) Field of Classification Search
CPC .... H05K 9/0035; H05K 1/0268; H05K 1/144; H05K 2201/10234; H05K 2201/2018; G01R 31/2884; G01R 31/2896; H01L 23/49816; H01L 24/16; H01L 2224/16225
See application file for complete search history.

(56) References Cited

U.S. PATENT DOCUMENTS

| | | | |
|---|---|---|---|
| 7,658,617 B1 * | 2/2010 | Brodsky | H05K 7/1069 439/83 |
| 7,956,631 B2 | 6/2011 | Chen et al. | |
| 10,398,051 B2 | 8/2019 | Kawabata | |
| 10,985,480 B2 | 4/2021 | Williams | |
| 2007/0275572 A1 | 11/2007 | William | |
| 2011/0147568 A1 * | 6/2011 | Miyake | H05K 7/1061 361/728 |
| 2013/0017721 A1 * | 1/2013 | Mason | H01R 13/6585 439/607.08 |

(Continued)

*Primary Examiner* — Pete T Lee

(57) ABSTRACT

A scalable, detachable interconnect system is provided that includes a shielded-frame structure having alignment features that forms a separable interconnect assembly which can be used to electrically couple at least two semiconductor devices. The interconnect system functions to protect, secure, and align electrical contacts on a first and a second semiconductor device coupled together. In this manner, the interconnect assembly realizes an electrical-mechanical interposer system that can securely connect semiconductor devices (e.g., printed circuit boards and semiconductor device packages) together while presenting electrical optimization features such as internal ground shielding and mechanical properties such as resilience, compliance, reusability, and reliable scrub motion to remove oxide from the pads or bumps.

16 Claims, 19 Drawing Sheets

(56) References Cited

U.S. PATENT DOCUMENTS

| | | | |
|---|---|---|---|
| 2013/0154678 A1* | 6/2013 | Nelson | G01R 1/06744 324/750.24 |
| 2018/0376610 A1 | 12/2018 | Kawabata | |
| 2019/0331712 A1 | 10/2019 | Williams | |
| 2019/0391180 A1 | 12/2019 | Williams | |
| 2020/0227844 A1 | 7/2020 | Williams | |

* cited by examiner

SHIELDED INTERCONNECT SYSTEM

CROSS-REFERENCE TO RELATED APPLICATIONS

This application claims the benefit of U.S. Provisional Application No. 63/052,416, filed Jul. 15, 2020, which is incorporated by reference herein in its entirety.

BACKGROUND

Field

This disclosure relates generally to an interconnect structure for electronic systems, and more specifically, to a shielded frame housing for electronic devices and electronic device testing.

Related Art

Consumers' insatiable appetite for new products that offer new features and functionality is driving accelerated product cycles. The use of packaged integrated circuits and their subsequent connection to various electronic systems has helped to create a host of new innovative products. The demand for timely introductions of these new products (e.g., mobile phones) drives a need for both innovative and creative interconnection schemes for connecting packaged integrated circuits or printed circuit boards.

In particular, electronic systems are becoming increasing available in denser and more compact footprints that require interconnection schemes to reduce their footprint size while simultaneously increasing feature functionality. In many cases, soldering has become the de-facto approach for attaching one printed circuit board to another to form complex systems. For example, some commercially available mobile phones use solder to connect subsystem printed circuit boards together. In particular, a mobile phone may include two high-density printed circuit boards forming the mother board, where the two high-density printed circuit boards are connected together using solder balls. FIG. 1 illustrates an example solder interposer 110 between upper 120 and lower PCBs 130 in some examples. Solder balls 140 and 150 enable the coupling between the PCBs and the interposer.

While soldering can address density issues, the soldering approach can create significant problems once a need to repair defective parts arises. When the two PCBs are soldered together, it will be extremely difficult, if not impossible, to repair the motherboard of the mobile phone. Soldering is also impractical when testing semiconductor devices, as it is often desirable to detachably connect devices when tested. Meanwhile, a separable interconnect scheme, such as pogo pins or other Z-axis interconnect technology, are inhibited by either cost or contact density limitations required by the latest mobile devices.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Figure 1:
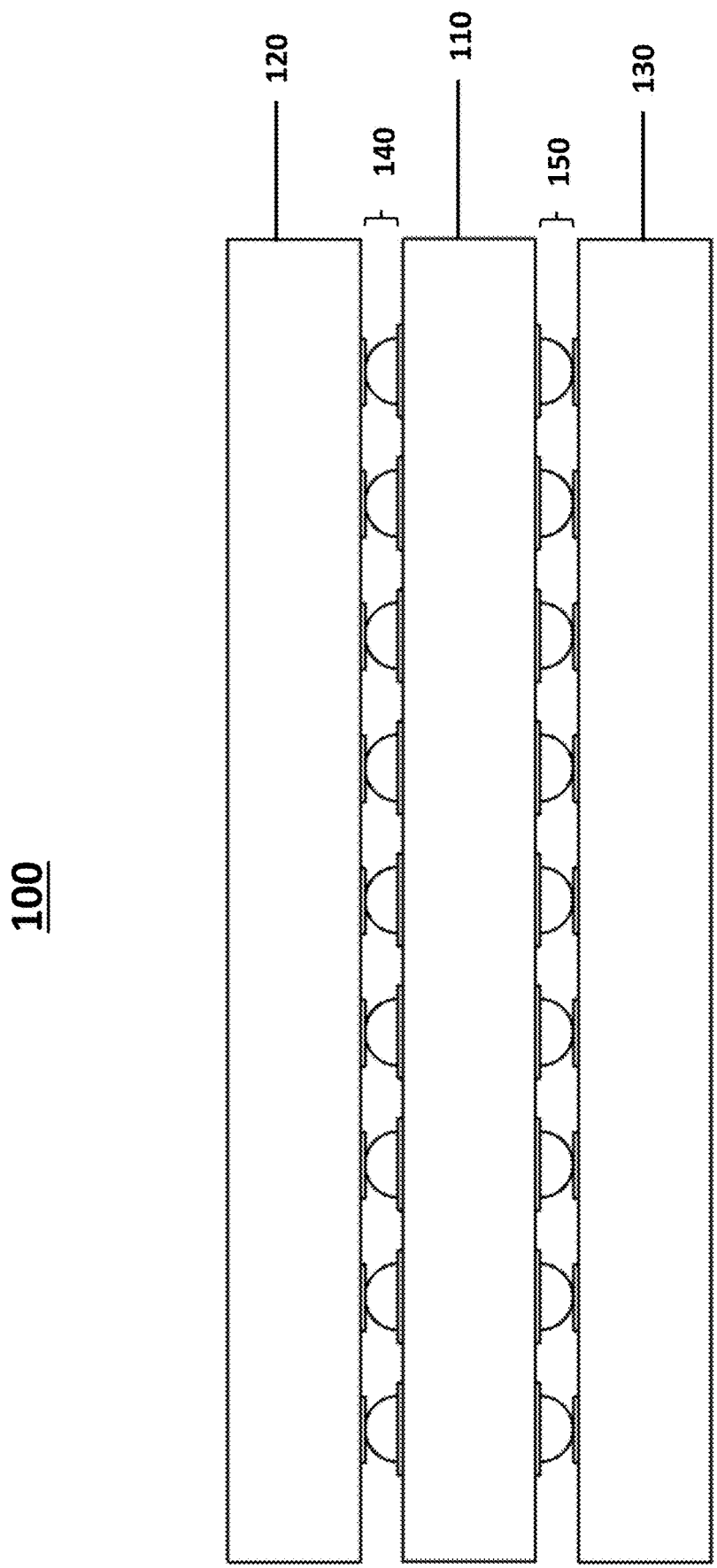
FIG. 1 illustrates an example solder interposer between upper and lower PCBs in some examples.

Embodiments of the present invention provide a scalable, detachable interconnect system that includes a shielded-frame structure having alignment features that forms a separable interconnect assembly which can be used to electrically couple at least two semiconductor devices. The interconnect system functions to protect, secure, and align electrical contacts on a first and a second semiconductor device coupled together. In this manner, the interconnect assembly realizes an electrical-mechanical interposer system that can securely connect semiconductor devices (e.g., printed circuit boards and semiconductor device packages) together while presenting electrical optimization features such as internal ground shielding and mechanical properties such as resilience, compliance, reusability, and reliable scrub motion to remove oxide from the pads or bumps.

In embodiments, the frame structure of the interconnect system incorporates a socket apparatus that includes integrated alignment features to aid in positioning the socket so that the socket can electrically and mechanically mate to a first semiconductor device (e.g., a printed circuit board (PCB) subsystem or a semiconductor device package) that contains surface mating pads. The first semiconductor device can then be aligned and compressed to the interconnect system, using a fastener, to connect to a second semiconductor device that contains matching surface pads coupled to the interconnect system. The resulting assembled structure can become a portion of a complex system of electrical components that are incorporated into an electronic device, such as a mobile phone.

In some embodiments, the shielded frame can be a stamped metal frame configured to align, secure and protect compliant electrical probes. In another embodiment, the shielded frame can be fabricated from a material that can offer electromagnetic interference (EMI) to shield the interposer structure and electrical components enclosed inside a perimeter of the frame. For example, the frame may be fabricated using a metallic material or a dielectric material that has embedded metallic material or is coated in a metallic material to provide the shielding. In this manner, the frame can serve as an EMI shielding for electrical components that are enclosed within the frame's perimeter, as well as a structure for protecting, securing, and aligning the interposer system.

In other embodiments, additional features can be directly integrated into the frame. These features can include screw down locations, holes for secondary alignment pins, fold down tab features intended to secure compliant interposers, and upper and lower stops that can prevent the compliant probes of the interposer structures from being crushed during coupling with the semiconductor devices. Such a frame structure is suitable for electrical coupling to matching pads of a PCB, for example, while providing EMI shielding to components that are enclosed inside the perimeter of the frame. Furthermore, devices that are located on the outside of the frame assembly can be shielded from devices located inside the inner perimeter of the frame assembly.

In embodiments of the present disclosure, the interconnect system includes the following features. First, the alignment frame contains features that align, secure and protect compliant probes from damage. Second, the frame housing includes contacting integrated upper and lower hard stops that function as over compression protection for upper and lower contacts. Third, the frame is fabricated using metallic material and may be directly connected to ground to provide shielding to components contained therein. Fourth, the interconnect system realizes an interconnection scheme that is enabled by heterogenous pitches (m×n), that is, different pitch in the x direction and the y direction. The features described herein are optional and some of the features may be omitted in embodiments of the present disclosure.

In embodiments of the present disclosure, electromagnetic shielding is the practice of reducing the electromagnetic field in a space by blocking the field with barriers made of conductive or magnetic materials. In some cases, a shield can be made of a conductive or magnetic material or have a secondary spray on coating applied. An effective electromagnetic shielding material should be capable of reflecting electromagnetic radiation from the surface of the frame housing such that internal electromagnetic fields cannot interact with external electromagnetic fields.

Figure 2:
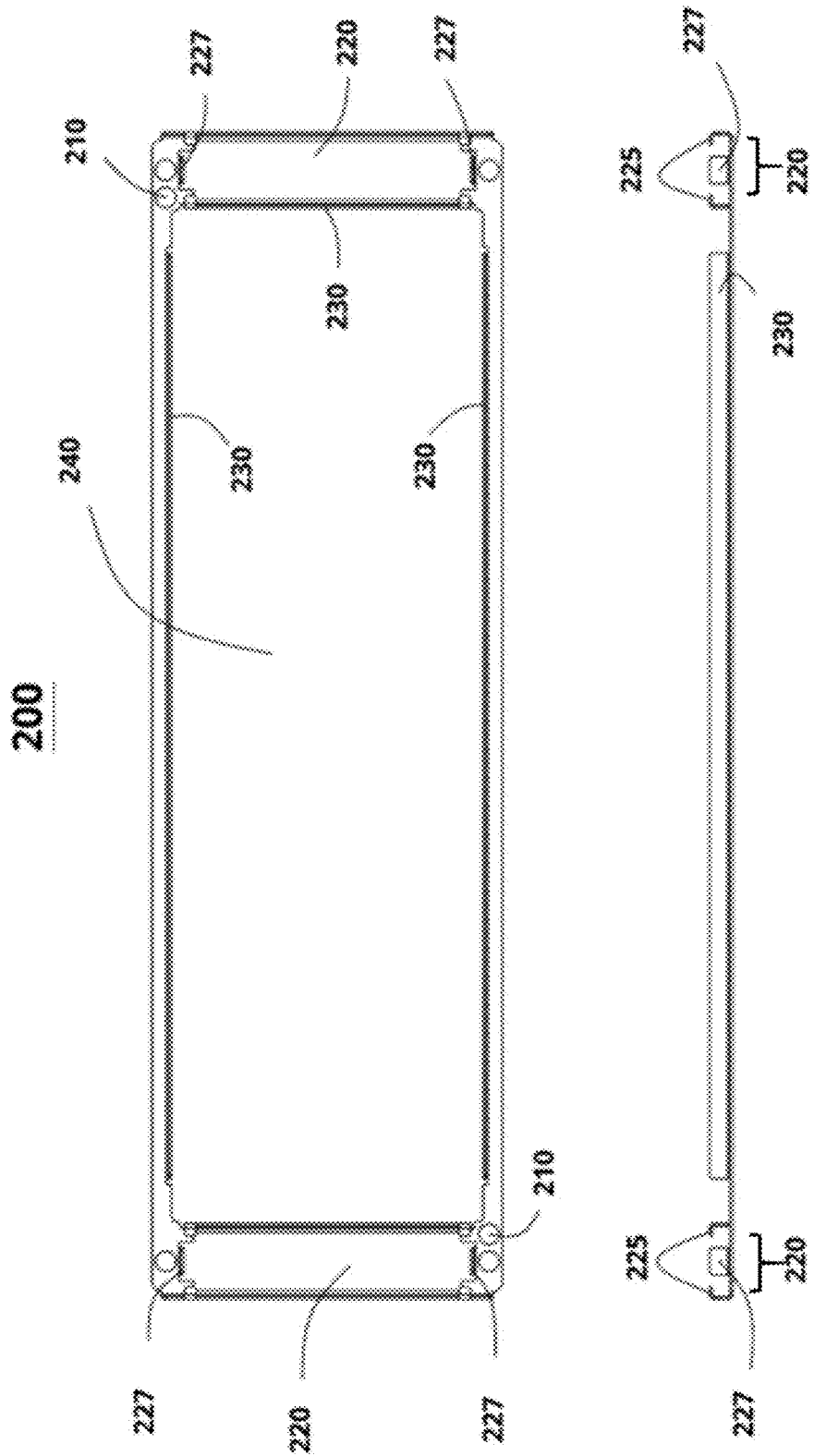
FIG. 2 illustrates a top and front view of a frame housing in accordance with an embodiment of the present disclosure.

FIG. 2 illustrates a top and front view of a frame housing 200 in accordance with an embodiment of the present disclosure. The frame housing includes alignment features, such as alignment pin locator holes 210. FIG. 2 illustrates the frame housing without modular compliant springs interposers incorporated. In the present example, it is understood that the frame is configured to incorporate interposers into socket areas 220, which are held in place by interposer locking tabs 225 at the two ends of the frame housing along with end tabs 227. The frame is further formed to provide a shielding wall 230 that provides electromagnetic interference (EMI) shielding between an inner region 240 and an outer region external to the frame housing.

Figure 3:
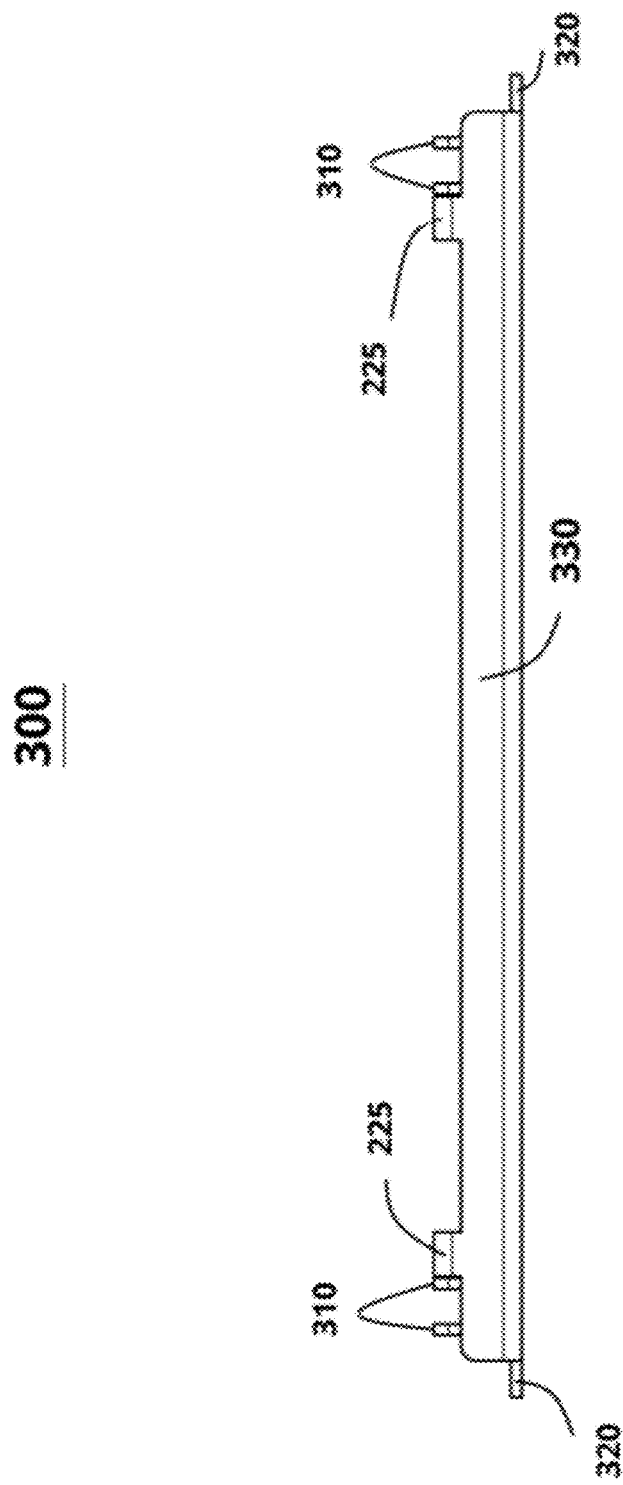
FIG. 3 illustrates an end view of frame housing, in accordance with embodiments of the present disclosure.

FIG. 3 illustrates an end view of frame housing 200, in accordance with embodiments of the present disclosure. Referring to FIG. 3, additional features of the interconnect system are shown. The additional features include upper compression stops 310 and lower compression stops 320, which prevent over compression of the compliant interposer contacts, and interposer locking tabs 225 that are configured to hold the interposers in the socket areas. In addition, an end EMI shielding wall 330 is illustrated extending along the socket area 220.

Figure 4:
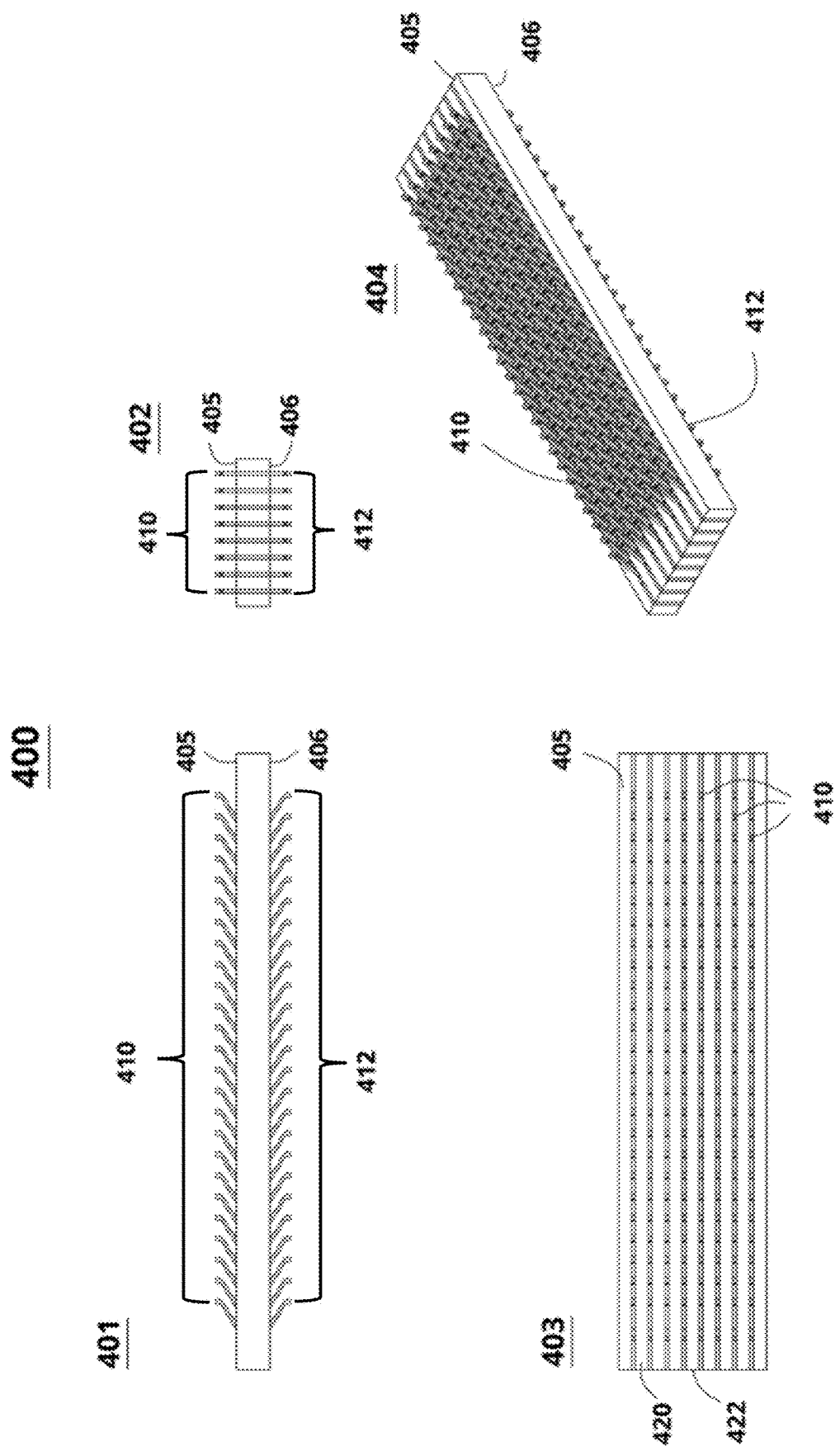
FIG. 4 illustrates views of a separately fabricated modular block, or interposer, having compliant spring connectors, in accordance with embodiments of the present disclosure.

FIG. 4 illustrates views of a separately fabricated modular block 400, or interposer, having compliant spring connectors, in accordance with embodiments of the present disclosure. Modular block 400 can be incorporated into a frame housing (e.g., frame housing 200) to form an interconnect system. FIG. 4 includes a side view 401, an end view 402, a top view 403, and a perspective view 404 illustration of a modular block 400 configured in accordance with an example embodiment of the present invention. In the present description, the modular block is also referred to as an interposer. Throughout this disclosure, the terms "interposer" and "modular block" are terms that refer to structure 400 and others providing similar functionality and may be used interchangeably.

Interposer 400 is configured to provide electrical conductivity from surface 405 to surface 406 using a conductor that extends from surface 405 as compliant pins 410, through the body of interposer 400, and extending from surface 406 as corresponding compliant pins 412. Interposer 400 can be formed using a conductive contact array of the compliant pins 410 and 412 formed from a conductive layer that is formed on a major surface of a corresponding isolation substrate (e.g., layers 420 and 422) and corresponding conductive contact array formed from another conductive layer formed on a second major surface of the isolation substrate.

In some embodiments, the modular connector block (or interposer) is constructed using the electrical connectors described in one of U.S. Pat. No. 11,047,878, U.S. Patent Publication 20190391180 A1, and U.S. Pat. No. 10,985,480.

Figure 5:
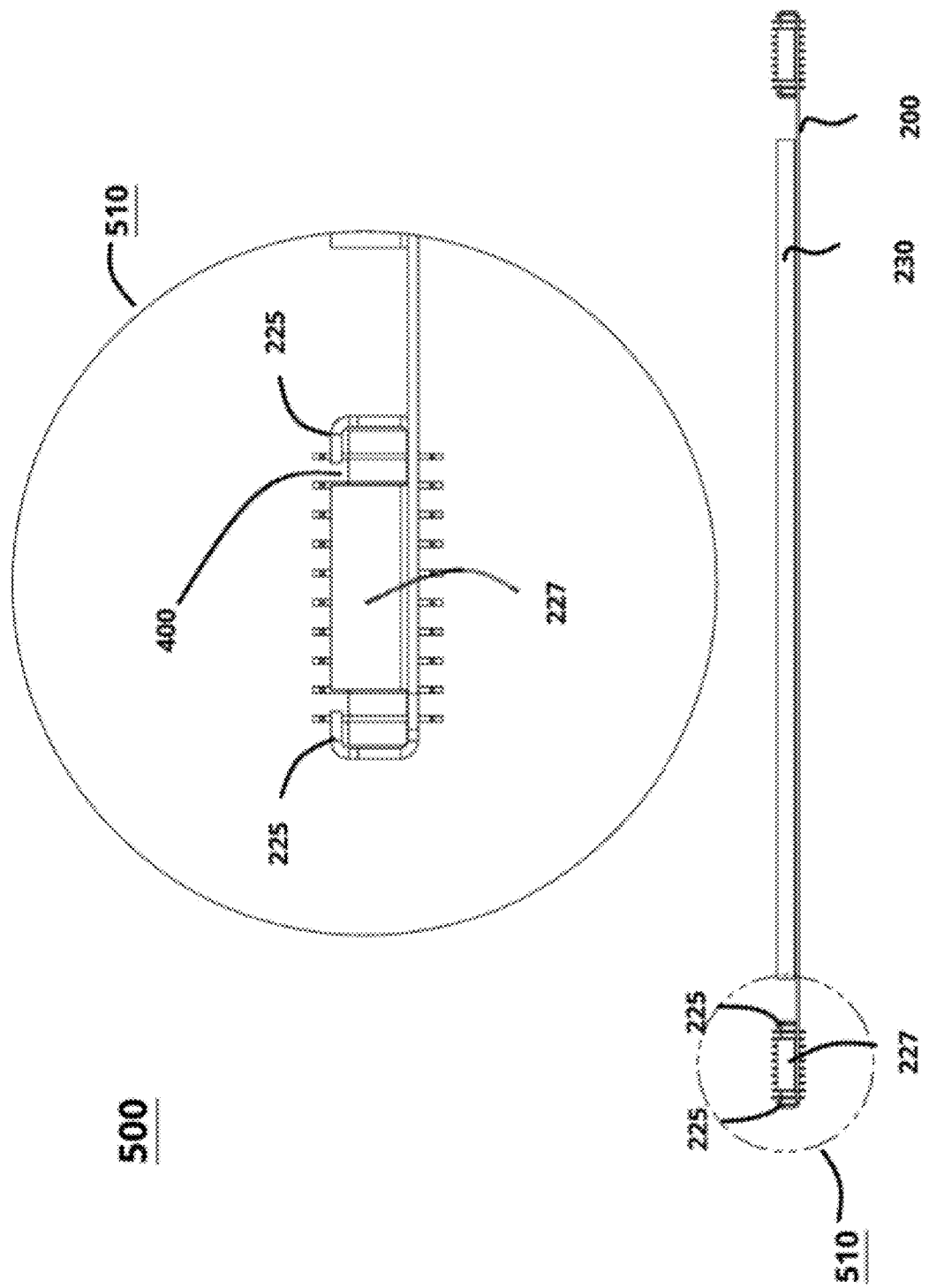
FIG. 5 illustrates the front view of an interconnect system with an interposer incorporated in a frame housing, in accordance with embodiments of the present invention.

FIG. 5 illustrates the front view of an interconnect system 500 with an interposer 400 incorporated in a frame housing 200, in accordance with embodiments of the present invention. Frame housing 200 provides shielding (e.g., shielding wall 230) from EMI. Interposer 400 is constrained by fold over tabs (e.g., retention tabs 225) and end tab 227. FIG. 5 also includes an enlarged view 510 of the interposer positioned inside the retention tabs of the frame housing. The retention tabs also function to restrain the amount of compression of the compliant pins of the interposer to prevent damage to the pins.

Figure 6:
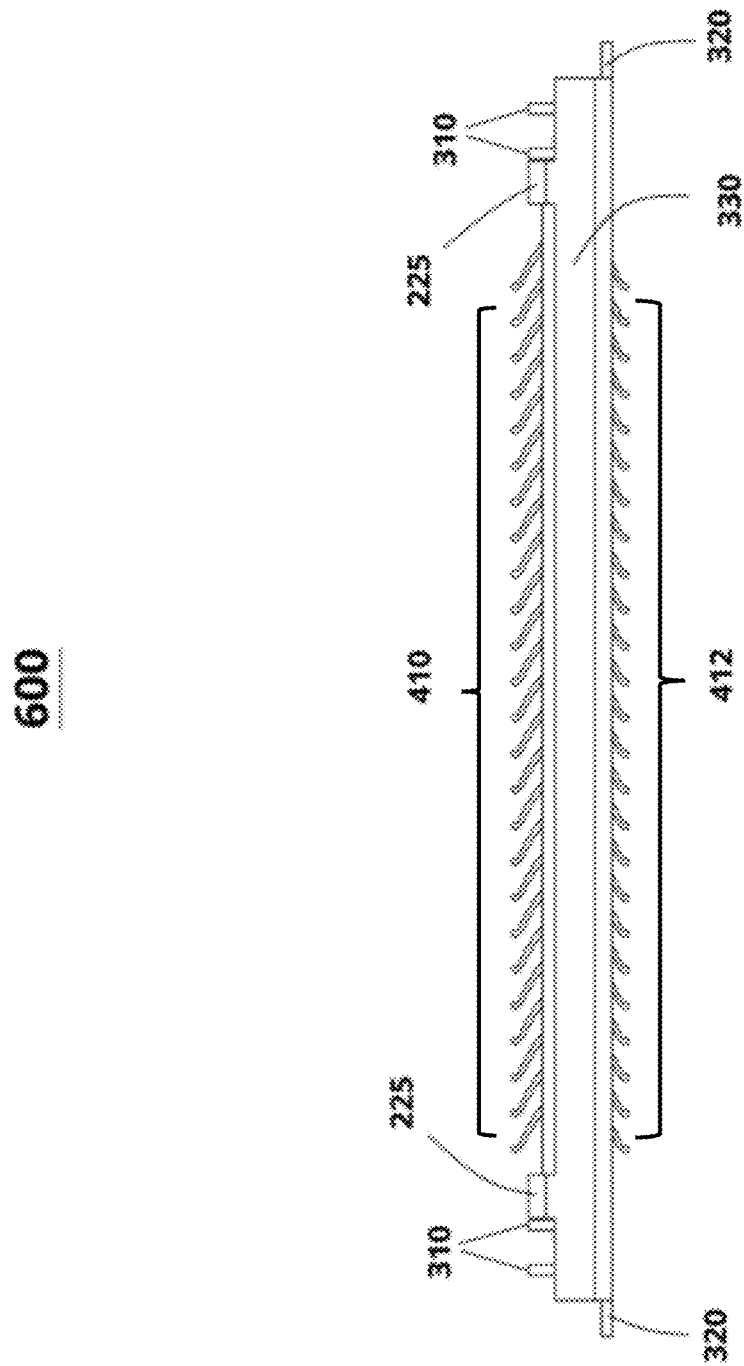
FIG. 6 illustrates an end view of interconnect system with an interposer incorporated therein, in accordance with embodiments of the present invention.

FIG. 6 illustrates an end view 600 of interconnect system 500 with an interposer 400 incorporated therein, in accordance with embodiments of the present invention. Referring to FIG. 6, compliant probes 410 and 412 of interposer 400 are shown extending above and below the interconnect system. The compliant probes make contact with mating pads on an upper and a lower semiconductor device package or printed circuit board. The interposer with the compliant probes is secured in frame housing 200 by fold-over tabs 225. FIG. 6 further illustrates other features of the interconnect system, including upper compression stops 310 and lower compression stops 320, which protect the compliant probes of the interposer.

Figure 7:
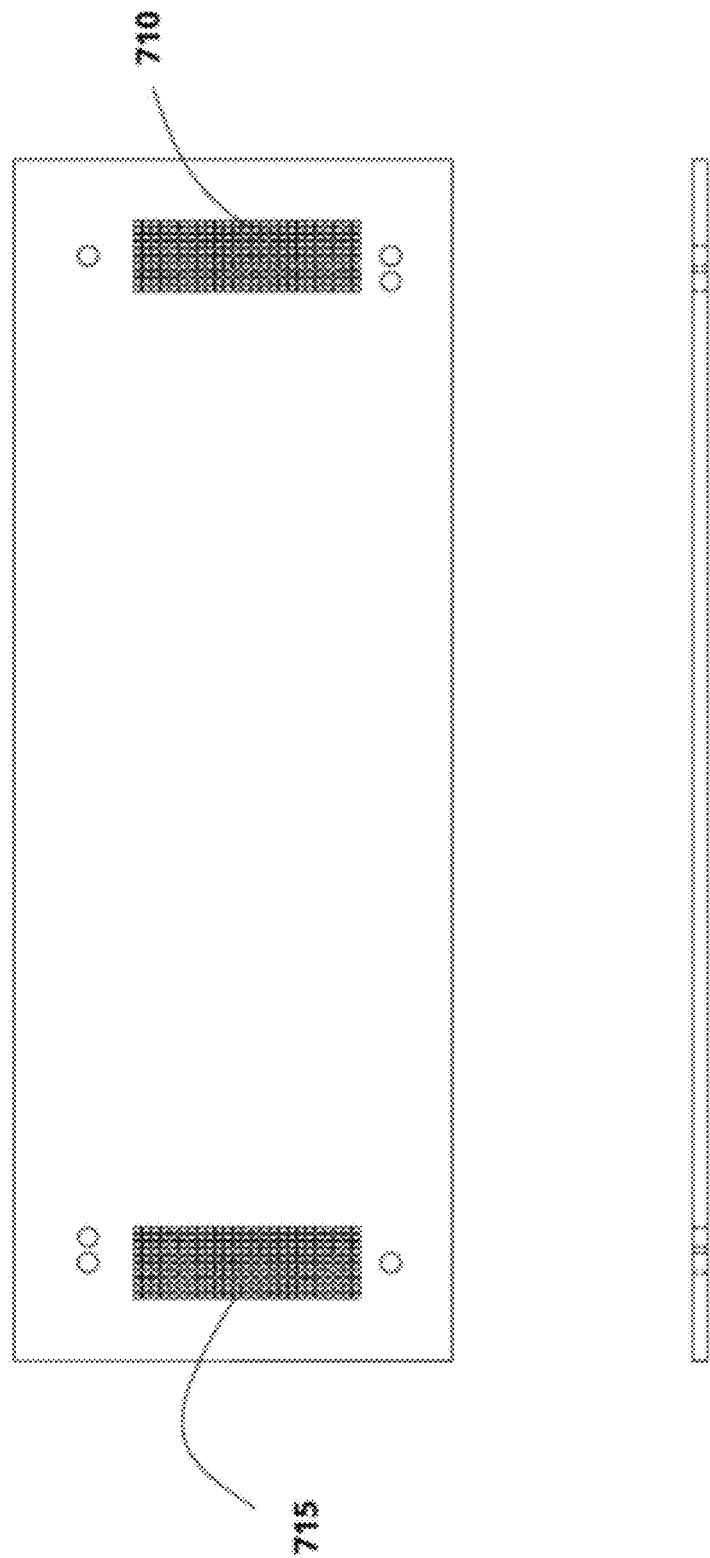
FIG. 7 illustrates an example of an upper PC board to which the interconnect system can be coupled, in accordance with embodiments of the present disclosure.

FIG. 7 illustrates an example of an upper PC board 700 to which the interconnect system can be coupled, in accordance with embodiments of the present disclosure. Referring to FIG. 7, mating pads 710 and 715 are formed on the two ends of upper PC board 700. The mating pads will be coupled to the interposer probes (e.g., 410) provided at corresponding ends of frame housing 200.

Figure 8:
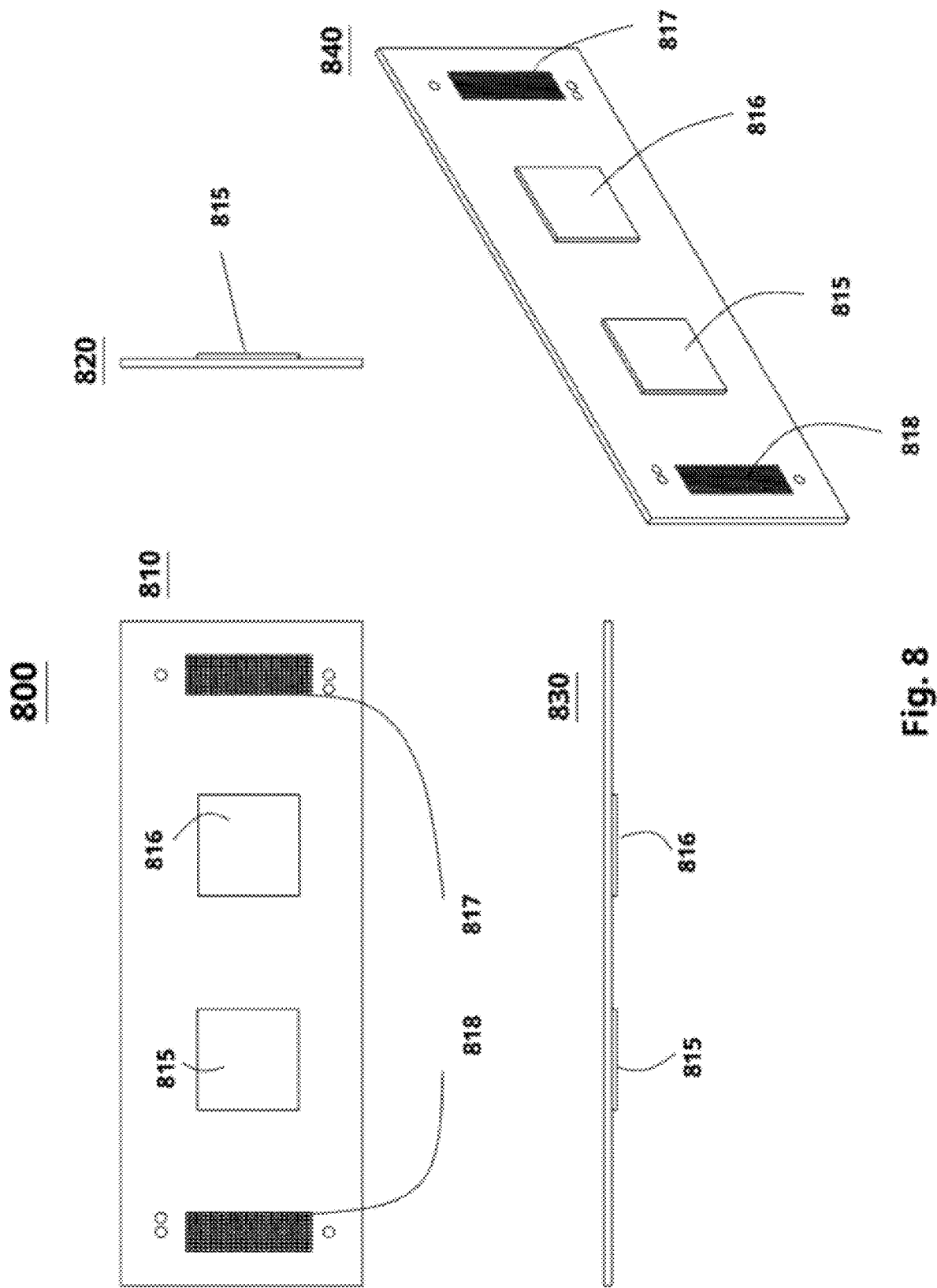
FIG. 8 illustrates an alternative example of an upper PC board to which the interconnect system can be coupled, in accordance with embodiments of the present disclosure.

FIG. 8 illustrates an alternative example of an upper PC board 800 to which the interconnect system can be coupled, in accordance with embodiments of the present disclosure. In particular, FIG. 8 illustrates upper PC board 800 from different perspectives (top 810, end view 820, side view 830, and perspective view 840) with integrated circuits 815 and 816 attached. Mating pads 817 and 818, as described above with respect to FIG. 7, are formed on two ends of upper PC board 800, and the integrated circuits are located between the mating pads.

Figure 9:
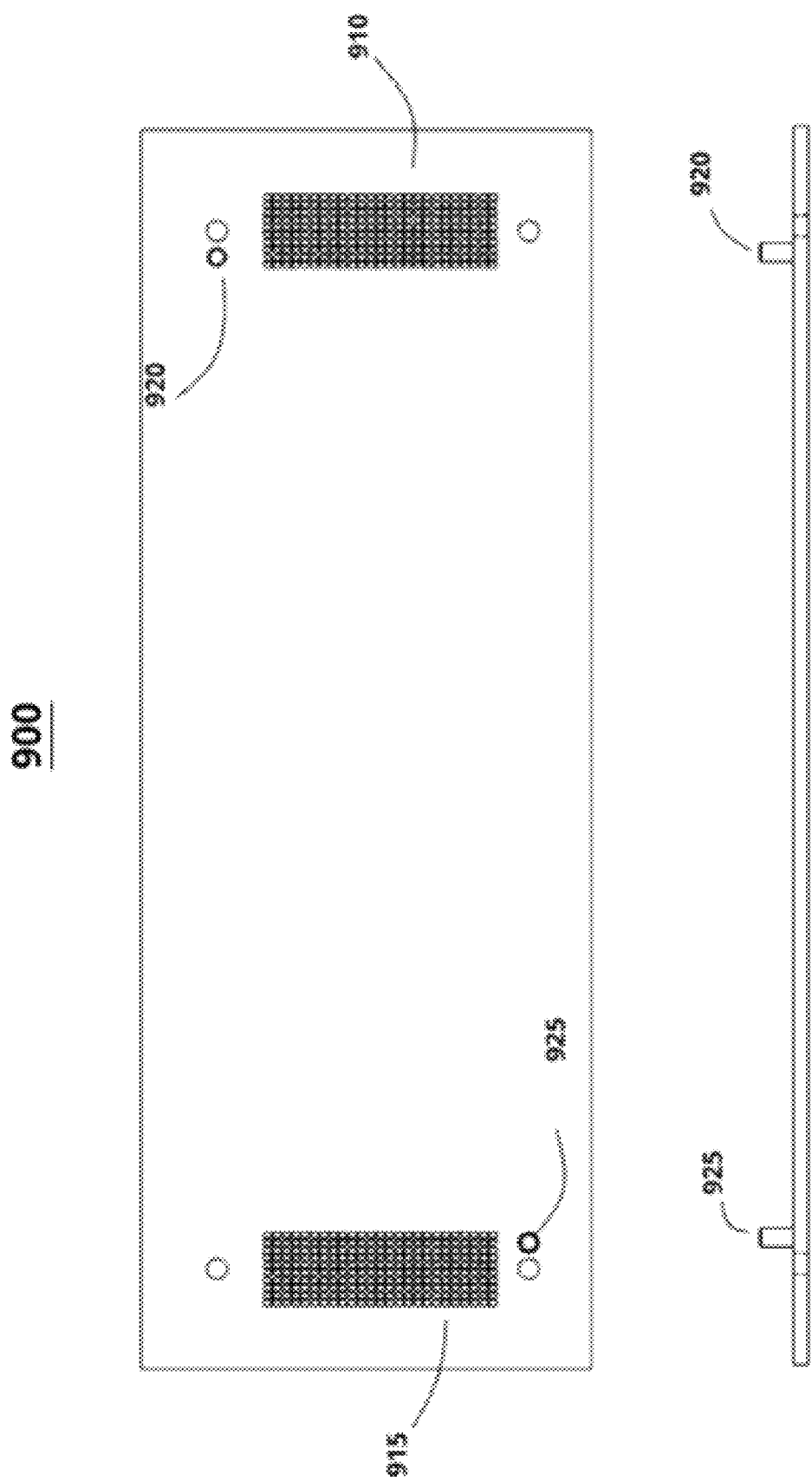
FIG. 9 illustrates an example of a lower PC board to which the interconnect system can be coupled, in accordance with embodiments of the present disclosure.

FIG. 9 illustrates an example of a lower PC board 900 to which the interconnect system can be coupled, in accordance with embodiments of the present disclosure. Referring to FIG. 9, mating pads 910 and 915 are formed on the two ends of lower PC board 900. The mating pads will be coupled to the interposer probes (e.g., 412) provided at corresponding ends of frame housing 200. In addition, alignment features 920 and 925 to aid in properly aligning lower PC board 900 with both frame housing 200 and upper PC board 700 to ensure the compliant probes of the interposer are coupled to the correct corresponding pads of the two PC boards.

Figure 10:
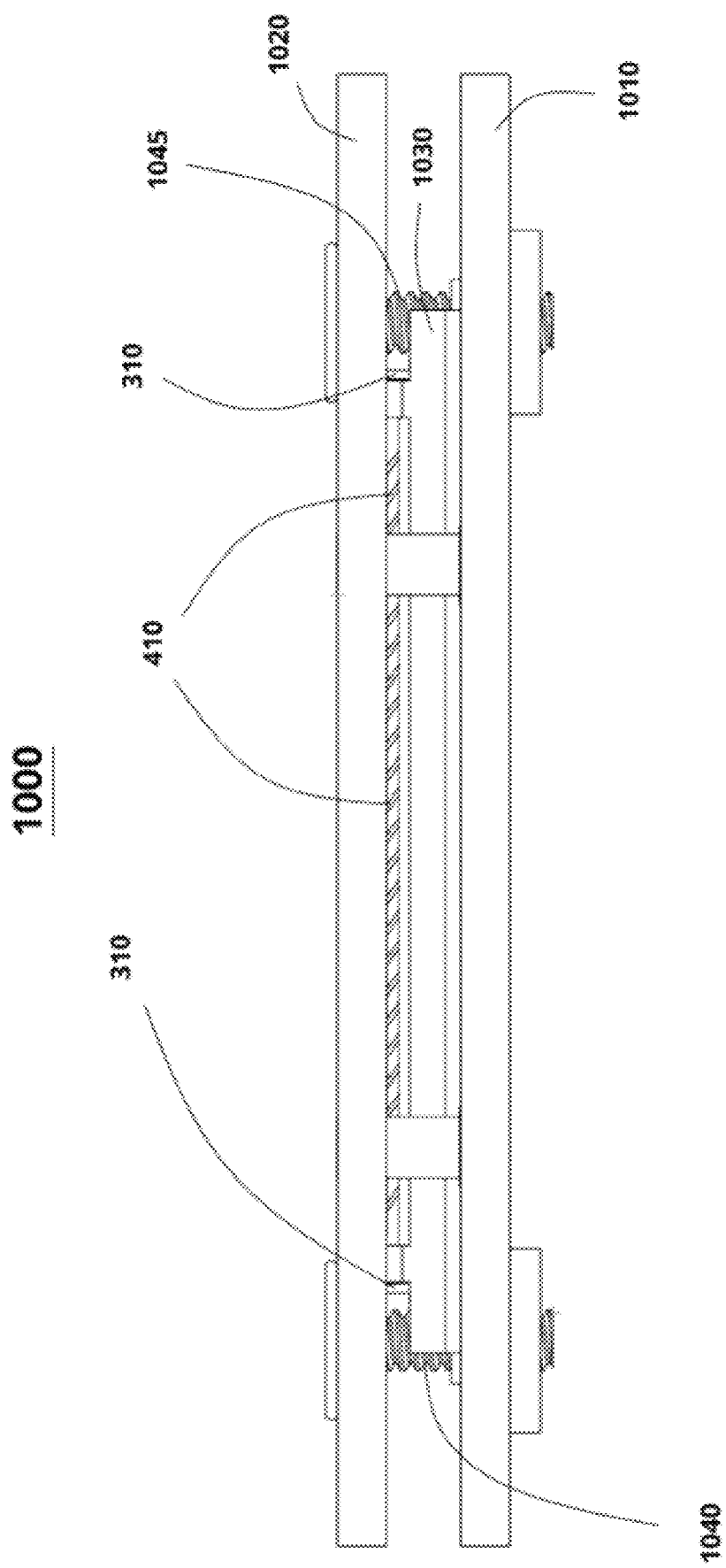
FIG. 10 illustrates an example of an end view of an assembled interconnect system with upper and lower semiconductor devices (e.g., PCBs).

FIG. 10 illustrates an example of an end view of an assembled interconnect system 1000 with upper and lower semiconductor devices (e.g., PCBs). In particular, lower PCB 1010 and upper PCB 1020 are assembled together with an interconnect system 1030 in between. An interposer (e.g., interposer 400) of the interconnect system electrically couples mating pads of the upper PCB (e.g., 710 and 715) to the mating pads of the lower PCB (e.g., 910 and 915). FIG. 10 also illustrates compliant pins (e.g., 410) in contact with mating pads on the upper PCB, providing the electrical coupling. The assembled structure can be secured together by one or more fasteners, such as screws 1040 and 1045. Compression stops 310 prevent the compliant pins from becoming over compressed during fastening.

Figure 11:
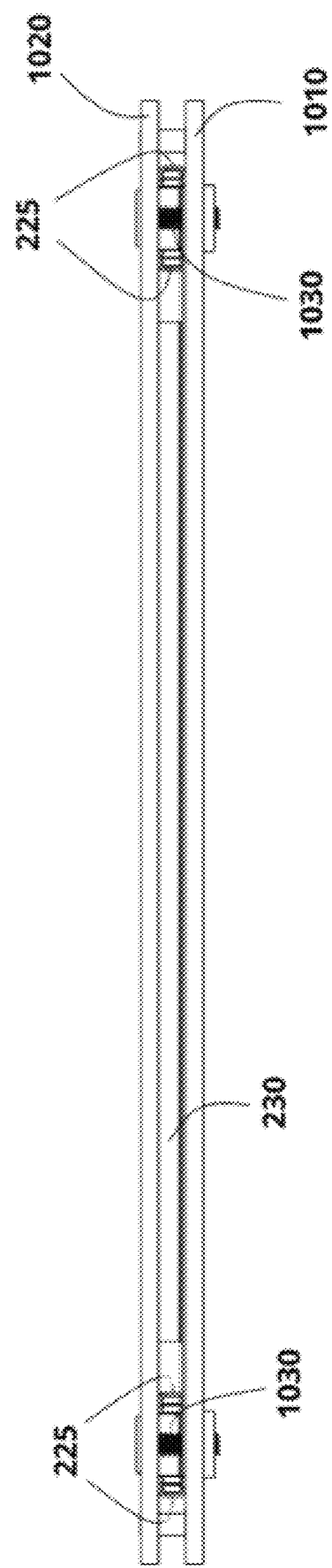
FIG. 11 illustrates an example of a front view of assembled interconnect system.

FIG. 11 illustrates an example of a front view of assembled interconnect system 1000. Again, semiconductor devices that include lower PCB 1010 and upper PCB 1020 are assembled together with interconnect system 1030 in between. The interposer (not visible) of the interconnect system electrically couples the mating pads of upper PCB 1020 to the mating pads of lower PCB 1010. Frame housing 200 of the interconnect system provides EMI shielding 230. The assembled structure is secured together by one or more fasteners, such as screws 1040 and 1045.

Figure 12:
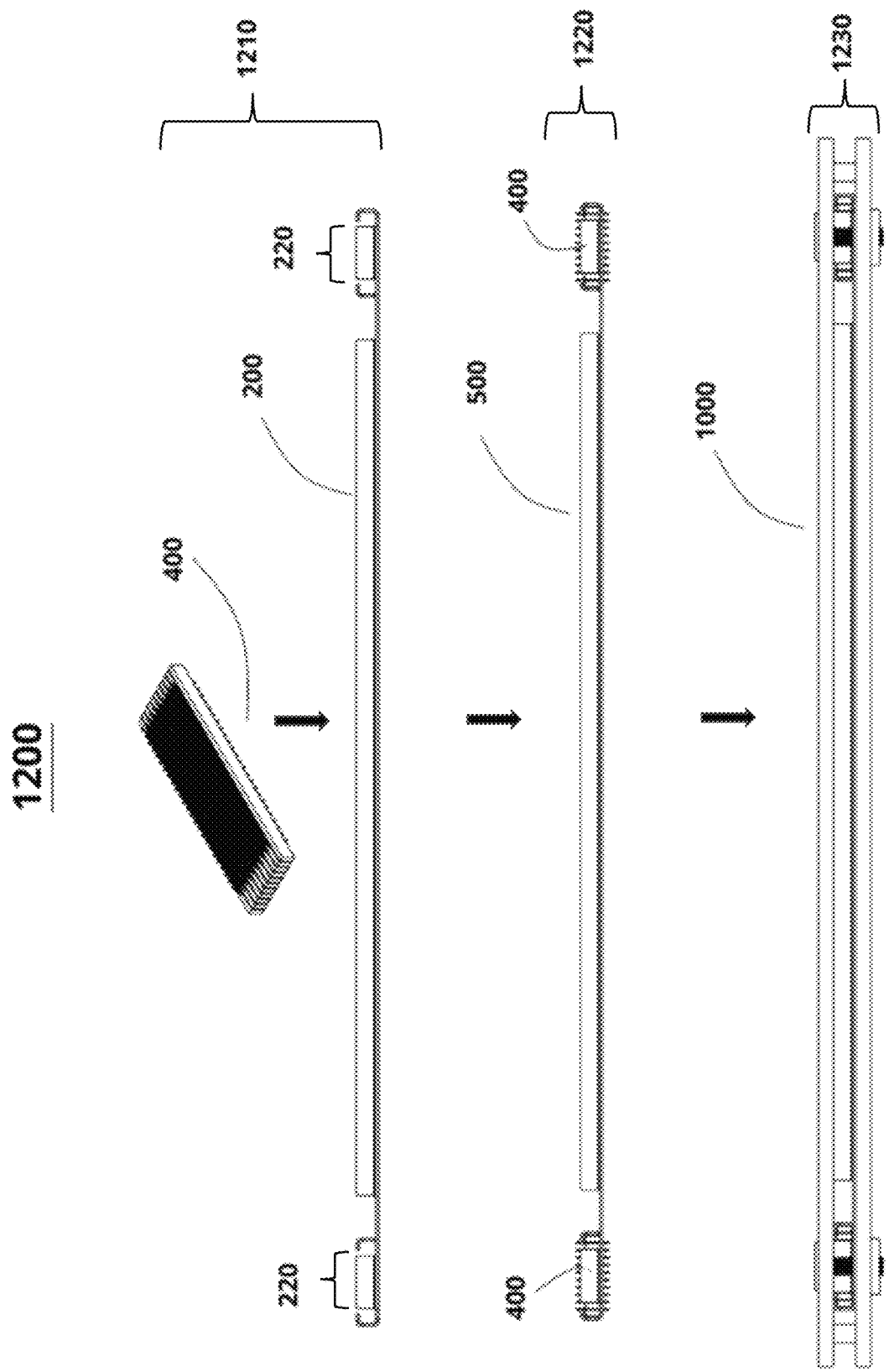
FIG. 12 is a simplified block diagram illustrating an example of steps performed in forming an assembled interconnect system, in accordance with embodiments of the present invention.

FIG. 12 is a simplified block diagram illustrating an example of steps performed in forming an assembled interconnect system, in accordance with embodiments of the present invention. In step 1210, one or more assembled interconnect blocks 400 and a frame housing 500 are provided. In step 1220, interconnect blocks 400 are inserted into socket areas 220 of frame housing 200 to form interconnect system 500. Subsequently, in step 1230, a first semiconductor device (e.g., lower PCB 1010) and a second semiconductor device (e.g. upper PCB 1020) are provided and coupled to interconnect system 500. The first and second semiconductor devices are attached to the frame housing such that connection pads on each of the semiconductor devices are aligned with corresponding compliant pins of the interconnect blocks of the interconnect system. The mated interconnect system with semiconductor devices can form, for example, a device mother board 1000.

Figure 13:
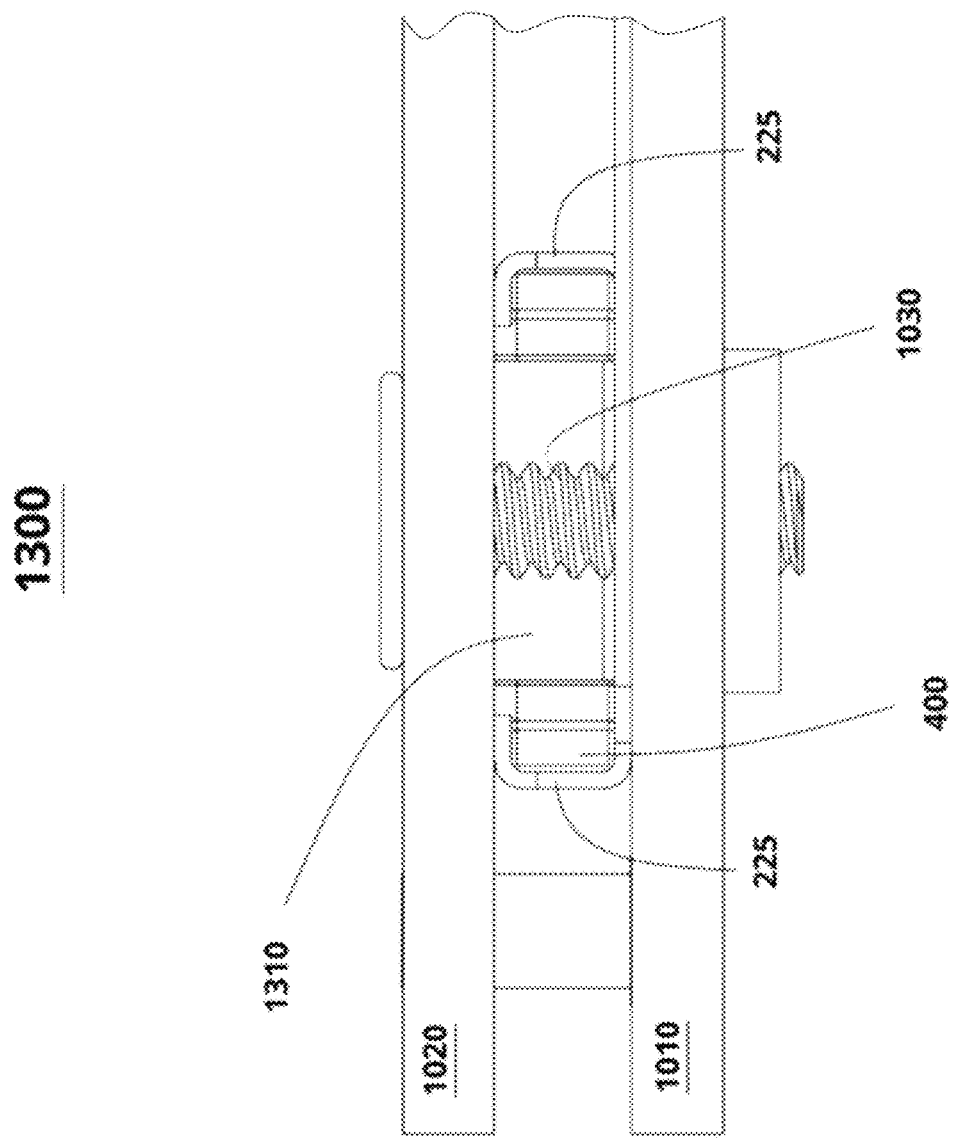
FIG. 13 is an enlarged view of an end of the structure illustrating a corner of the assembled structure with an example of the fastener from FIG. 11.
Figure 14:
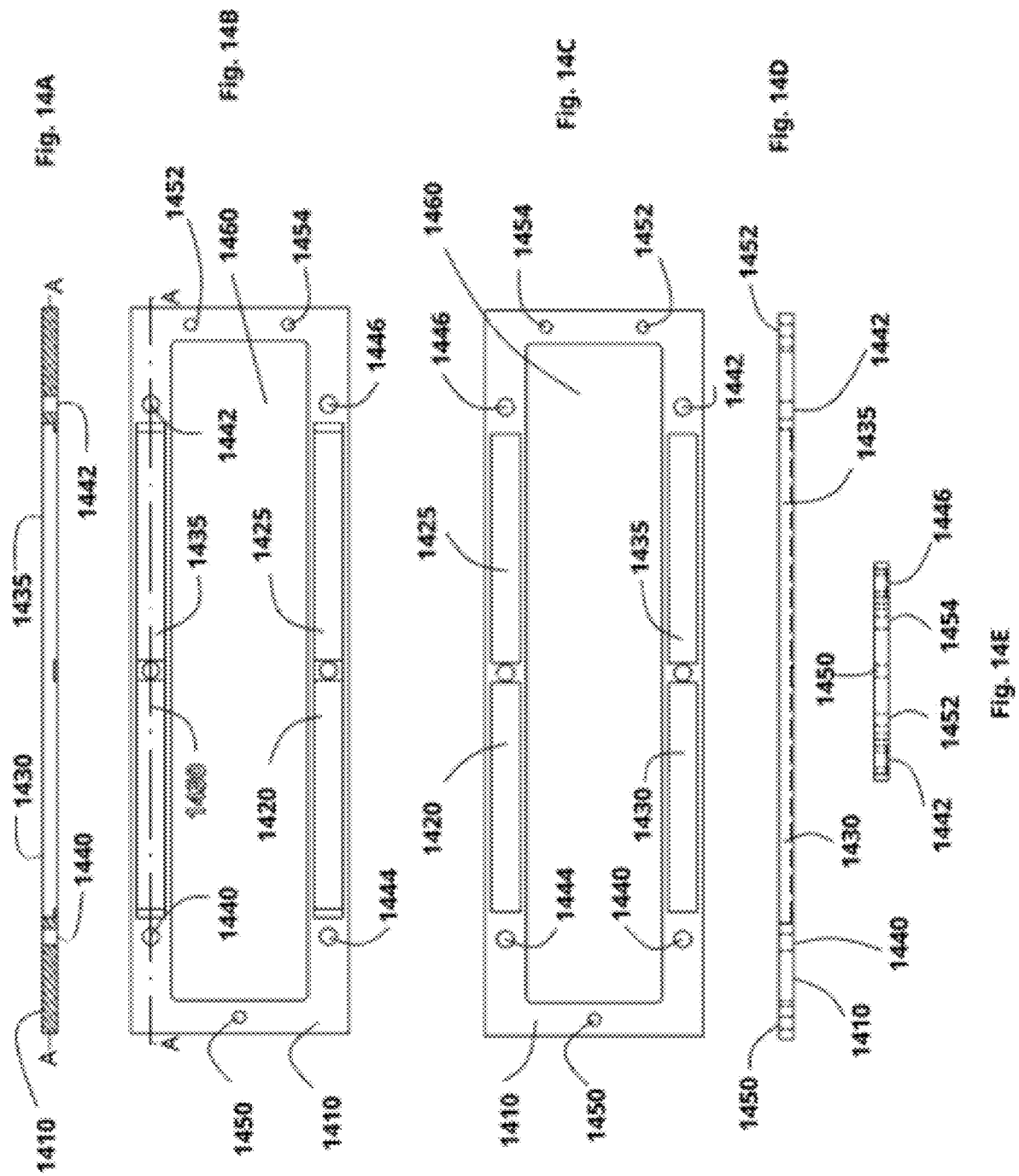
FIGS. 14A-14E illustrate another embodiment of a frame housing in accordance with embodiments of the present disclosure.

FIG. 13 is an enlarged view of an end of the structure 1000 illustrating a corner of the assembled structure with an example of the fastener from FIG. 11. Locking tabs 225 hold an interposer 400 and further form compression stops to protect the compliant pins of interposer 400 from over compression. In one example application of the structure illustrated in FIGS. 11 and 13, the assembled structure can form a mother board of a mobile device, where integrated circuits are shielded within the frame housing from signals provided by the PCBs through the interposers. FIG. 13 also illustrates a hard stop 1310 that can further prevent over compression between the first and second semiconductor devices.

FIGS. 14A-14E illustrate another embodiment of a frame housing in accordance with embodiments of the present disclosure. A frame housing 1410 can be formed from a conductive material using a variety of methods known in the art (e.g., stamping, computer numerical control (CNC) machining, or by die casting). Materials used to form the frame can generally include any conductive material, such as, but not limited to, aluminum, copper, titanium, tungsten, a metal alloy, and the like. Frame housing 1410 can also be formed from a dielectric material impregnated with or coating with a conductive material, such as those listed above.

Dielectric materials can be formed into the frame housing structure using a molding process. Some common plastic resin materials used in fabrication of molded parts include, for example, polyethylene (PE or PET), polycarbonate (PC), acrylonitrile butadiene styrene (ABS), and polyoxymethylene (POM). Since these various materials have their own unique properties, it is important to consider overall defining characteristics that are associated with each material category. Additives and fillers can be used to fine tune desired mechanical and electrical material properties required for a particular application.

FIGS. 14A-E illustrate the structure of the frame housing, including an upper view of the frame housing (FIG. 14B) and a lower view of the frame housing (FIG. 14C), along with a front view (FIG. 14D) and an end view (FIG. 14E). FIG. 14A is a cross section view through two socket areas 1430 and 1435. Frame housing 1410 includes socket areas 1420, 1425, 1430, and 1435, into which interposers similar to those discussed above (e.g., interposer 400) can be incorporated. As with the embodiments discussed above, compliant pins extend from the interposers toward the upper and lower surfaces of the frame housing and are configured to electrically couple semiconductor devices provided to the upper and lower surfaces of the frame housing.

Frame housing 1410 further includes fastener holes 1440, 1442, 1444, and 1446 configured for fasteners to pass through to couple a semiconductor device at the upper surface to a semiconductor device at the lower surface of the frame housing, in order to form an assembled interconnect system. In addition, frame housing 1410 can include alignment features 1450, 1452, and 1454 to aid in alignment of the semiconductor devices coupled to the frame housing. As with frame housing 200, frame housing 1410 forms an inner region 1460 that is shielded from a region outside the frame housing, and from signals passing through the interposers. This shielding is provided by the conductive material forming the frame housing or may be added later using a secondary process such as plating or spraying on, if the base material is non-conductive.

Figure 15:
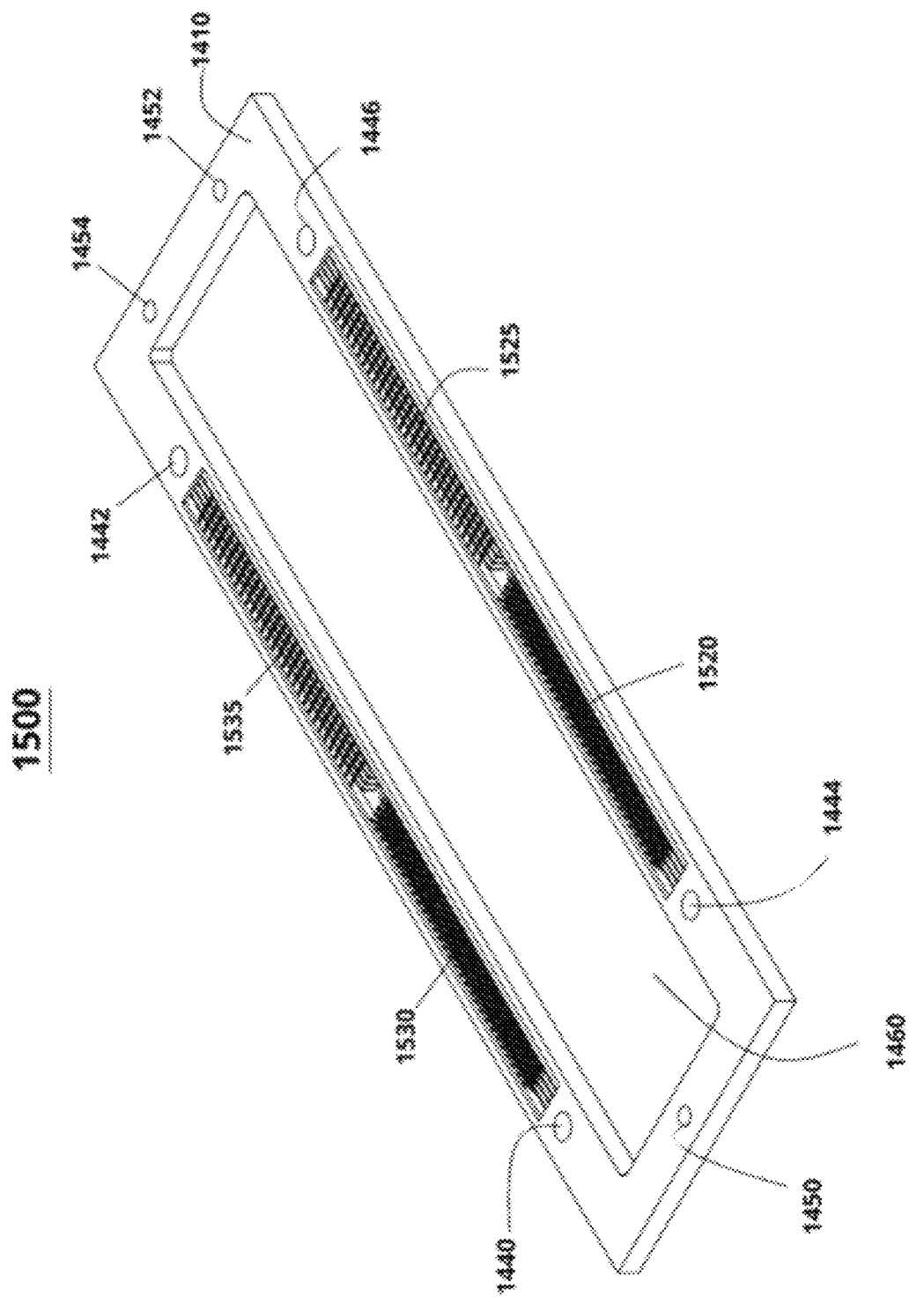
FIG. 15 illustrates a perspective view of frame housing with a set of integrated interposers in accordance with the alternate embodiment of the present disclosure.

FIG. 15 illustrates a perspective view 1500 of frame housing 1410 with a set of integrated interposers in accordance with the alternate embodiment of the present disclosure. As compared with the embodiments illustrated in FIG. 2, interposer blocks 1520, 1525, 1530, and 1535 are incorporated along the long sides of frame housing 1500. This illustrates some of the flexibility that embodiments of the present disclosure can provide in location of coupling pads and the corresponding interposer structures.

Figure 16:
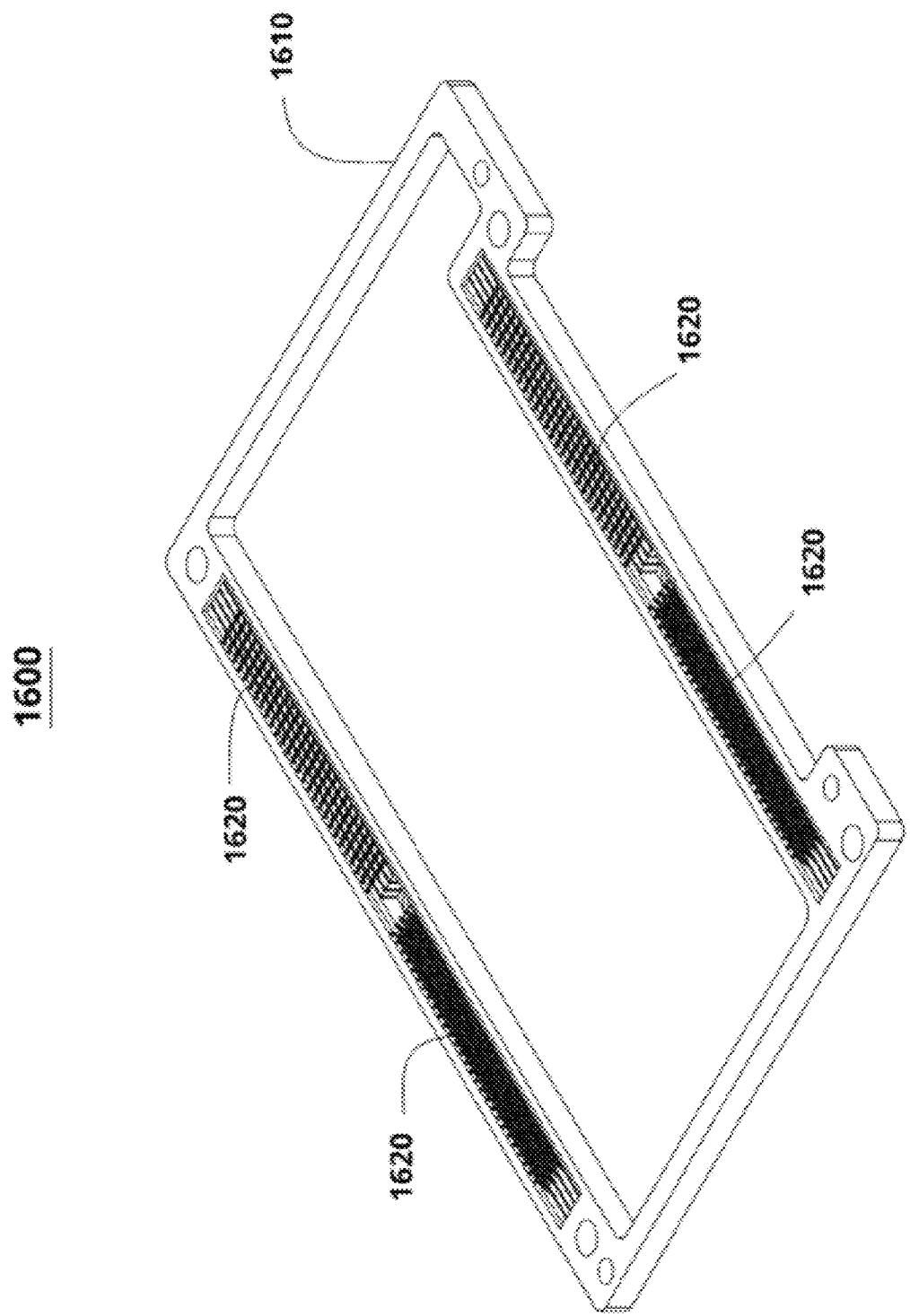
FIG. 16 illustrates a perspective view of frame housing with a set of integrated interposers in accordance with another alternate embodiment of the present disclosure.

FIG. 16 illustrates a perspective view 1600 of frame housing 1610 with a set of integrated interposers 1620 in accordance with another alternate embodiment of the present disclosure. As with the embodiment illustrated in FIG. 15, an interconnect system in the illustrated embodiment incorporates the interposer blocks along the long sides of the frame housing. But in the embodiment illustrated in FIG. 16, the frame housing can have an irregular shape to meet the design of the end product. This further illustrates some of the flexibility that embodiments of the present disclosure can provide in location of coupling pads and geometry. The frame housing can be designed to have various shapes suitable to the device end product, and the use of a rectangular or mostly rectangular structure in the above-described embodiments is illustrative only and not intended to be limiting.

Figure 17:
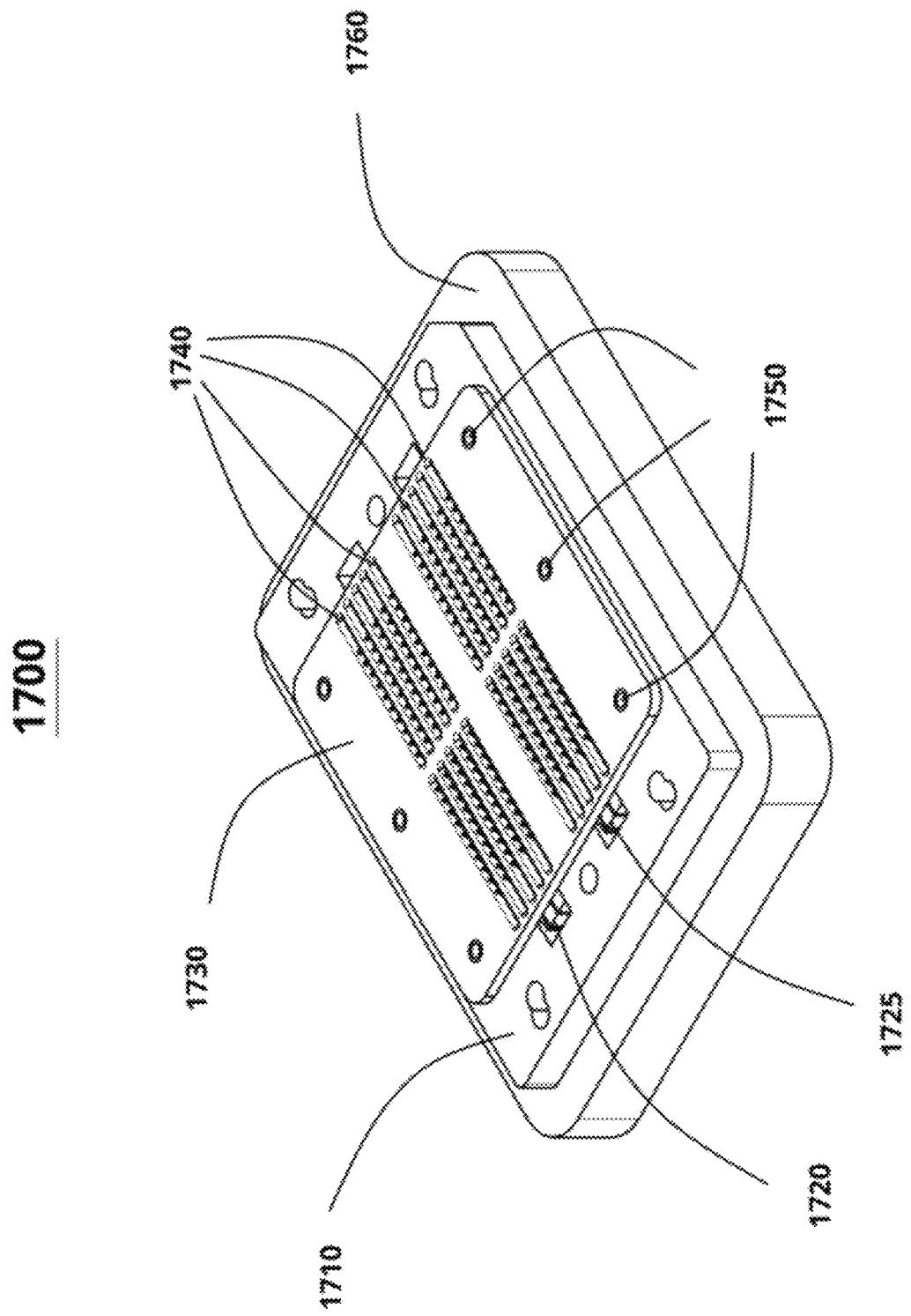
FIG. 17 illustrates a perspective view of an interconnect structure including a frame housing with a set of integrated interposers and an accompanying shroud structure, in accordance with another alternate embodiment of the present disclosure.

FIG. 17 illustrates a perspective view of an interconnect structure 1700 including a frame housing 1710 with a set of integrated interposers and an accompanying shroud structure 1730, in accordance with another alternate embodiment of the present disclosure. A frame housing 1710, similar to those described above with regard to FIGS. 14-16, is provided. As above, this frame housing can be formed of a conductive metal or other material having conductive or shielding properties. In addition, should the frame not be configured to provide a shielded region within the area of the frame, the frame can also be formed of an insulating material.

Interposer structures 1720 and 1725 are incorporated in frame housing 1710, in the same manner as described above. These interposers provide compliant pin conductors that can provide electrical coupling between a semiconductor device at the top surface of the frame housing and a semiconductor device at the bottom surface of the frame housing. Shroud structure 1730 includes openings 1740 that permit the compliant pin conductors to pass through. Shroud structure 1730 is formed from an insulating or dielectric material. Common plastic resins used in fabrication of such molded parts are polyethylene, polycarbonate, acrylonitrile butadiene styrene, and polyoxymethylene. Shroud structure 1730 is attached to frame structure 1710 by one or more fasteners 1750. Fasteners 1750 can take a variety of forms, including screws or spring-loaded snap latches that provide a spring force between the shroud and the frame housing.

As illustrated in FIG. 17, fasteners 1750 further attach frame housing 1710 to a semiconductor device 1760 to form a system that can include, for example, a testing device. In such a system, a device under test can be temporarily electrically coupled to the compliant pin connectors through the shroud structure. As discussed below, the shroud structure can hold signal contacts of the device under test in proper contact with the compliant pin conductors of the interposer for communication with the testing device. In such embodiments, the frame housing with shroud structure combination acts as a hardware interface to the testing device. Embodiments provide an easier mechanism for connecting a device under test to circuitry within the testing device, allowing for faster, more accurate connection and disconnection.

Figure 18:
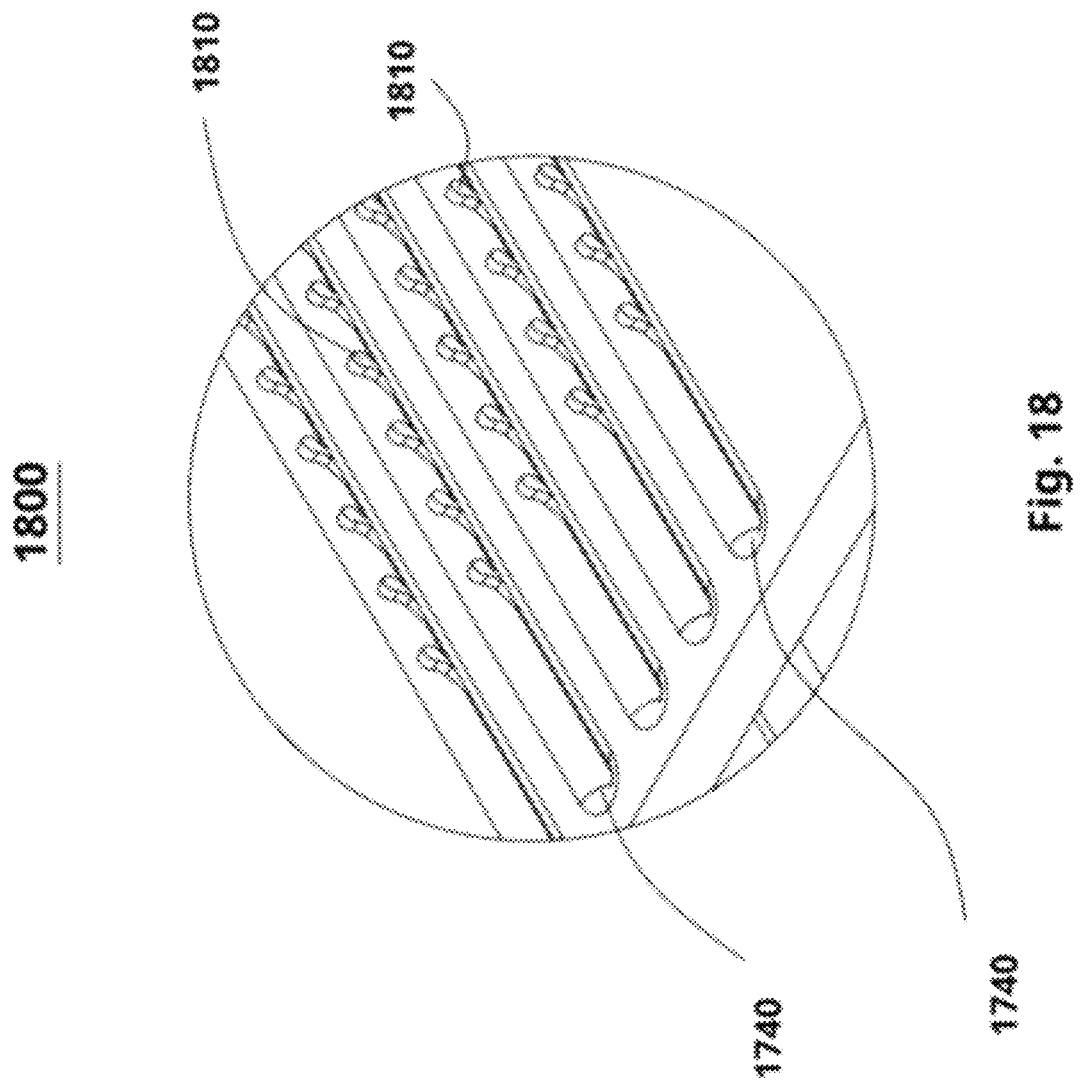
FIG. 18 is an expanded view of a portion interconnect structure showing openings in shroud structure.

FIG. 18 is an expanded view of a portion of an interconnect structure 1700 showing openings 1740 in shroud structure 1730. Compliant pins 1810 from an interposer (e.g., interposer 1720 and 1725) extend into the openings of the shroud structure. In addition, shroud structure openings 1740 provide a contoured region in which ball conductors or other pads from a semiconductor device can fit and come into contact with the compliant springs. The shroud structure opening contour permits more accurate alignment of the semiconductor device contacts with the compliant pins of the interposer. The shroud structure openings also serve to restrict the motion of the compliant pins to a vertical plane without bending to the side and thereby coming into contact with neighboring pins or coming out of contact with a semiconductor device contact. This will be described in greater detail below. An additional feature of the shroud structure is that the contoured openings can be configured to prevent the semiconductor device contacts from over compressing the compliant pins of the interposers.

Figure 19:
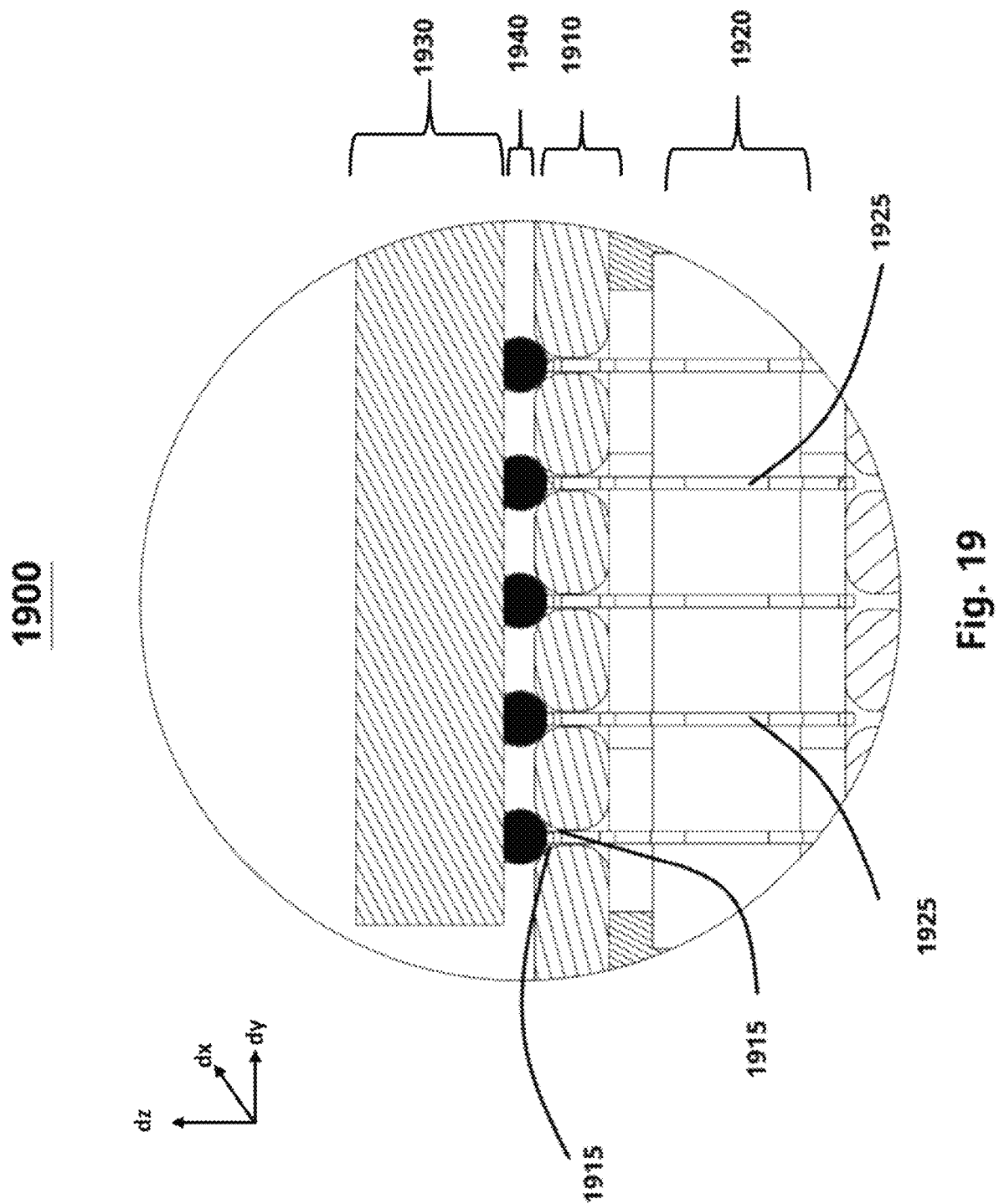
FIG. 19 is a cross-section view of a shroud structure over an interposer structure with a semiconductor device having solder ball connectors in contact with complaint pins from the interposer structure, in accordance with embodiments of the present disclosure.

FIG. 19 is a cross-section view 1900 of a shroud structure 1910 over an interposer structure 1920 with a semiconductor device 1930 having solder ball connectors 1940 in contact with complaint pins from the interposer structure, in accordance with embodiments of the present disclosure. Compliant pin conductors 1925 of interposer structure 1920 extend through openings 1915 of shroud structure 1910. A semiconductor device 1930 has solder ball-type conductors 1940 on a major surface facing the shroud structure. Openings 1915 are contoured in a manner to cradle the solder balls and direct the solder balls to compliant pin conductors 1925. As illustrated, openings 1915 allow motion of the compliant pin conductors in both the vertical direction (dz) and in a lateral direction (dx), while motion in the y direction is restricted. In addition, openings 1915 are shaped to prevent solder balls 1940 from over compressing the compliant pin conductors.

Interposer structure 1920 is illustrated as providing compliant pin conductors 1925 each between a single layer of dielectric material. But embodiments are not restricted to such an interposer arrangement. Different layers can be between the compliant pin conductors, providing, for example, grounding layers between each compliant pin conductor layer. Further, a shroud structure can be provided on both the top and bottom major surfaces of the interconnect structure to enhance the ability to connect ball conductors of semiconductor devices at both surfaces of the interconnect structure. Alternatively, the interposer structure can be provided in a testing environment, where the shroud structure enhances coupling of a device-under-test (DUT) to test circuitry. In such cases, there can be compliant pin conductors extending from the top surface of the interposer structure through the shroud structure, along with corresponding soldered connectors on the opposing, bottom surface of the interposer structure.

By now it should be appreciated that there has been provided an interconnect system as an embodiment of the present invention. The interconnect system includes one or more interposer blocks having a plurality of conductors and a frame housing. Each conductor of the plurality of conductors includes a first end and a second end, and the first end of each conductor forms a compliant spring. The frame housing is configured to secure the one or more interposer blocks in a fixed location on the frame housing and to protect the compliant springs of each conductor from being over compressed when in contact with a first semiconductor device to the first end of each conductor. The first end of each conductor is exposed at a first major surface of the frame housing and the second end of each conductors exposed at a second major surface of the frame housing.

In one aspect of the above embodiment, the frame housing includes a conductive material. In a further aspect, the frame housing includes a cavity that is electromagnetically shielded by the frame housing.

In another aspect of the above embodiment, the interconnect system further includes a first shroud structure coupled to the first major surface of the frame housing. The first shroud structure includes a plurality of openings. The first end of each conductor corresponds to and extends through an opening through the first shroud structure, and each opening is configured to restrict movement of each of the first end of the plurality of conductors to a single plane. In a further aspect, the first shroud structure is further configured to align signal contact elements of a first semiconductor device with a corresponding set of the first end of the plurality of conductors. In still a further aspect, the first shroud structure is further configured to prevent the corresponding set of the first end of the plurality of conductors from over compression due to contact with the signal contact elements. In another aspect, the first shroud structure is coupled to the frame housing in a region to protect conductors at the first major surface of the frame housing. In still another aspect, the first shroud structure includes an insulating material.

In another aspect of the above embodiment, the second end of each conductor forms a second compliant spring and the frame housing is configured to protect the second compliant spring from being over compressed when in contact with a second semiconductor device to the second end of each conductor. In a further aspect, the interconnect system further includes a first shroud structure coupled to the first major surface of the frame housing and a second shroud structure coupled to the second major surface of the frame housing. The first and second shroud structures both include a plurality of openings. The first end of each conductor corresponds to and extends through an opening through the first shroud structure. The second end of each conductor corresponds to an extends through an opening of the second shroud structure. Each opening of the first shroud structure is configured to restrict movement of each of the first end of the plurality of conductors to a single corresponding plane. Each opening of the second shroud structure is configured to restrict movement of each of the second end of the plurality of conductors to the same corresponding plane as that of the first shroud structure.

In yet another aspect of the above embodiment, the second end of each conductor is soldered to a second semiconductor device. In a further aspect, the second semiconductor device includes a testing device configured to test circuitry in the first semiconductor device.

Another embodiment of the present invention provides a system that includes a first semiconductor device including first circuitry electrically coupled to a first plurality of signal contacts, a second semiconductor device including second circuitry electrically coupled to a second plurality of signal contacts, and an interconnect system coupling the first and second semiconductor devices. The interconnect system includes one or more interposer blocks including a plurality of conductors and a frame housing. Each conductor includes a first end and a second end. The first end of each conductor forms a compliant spring that is electrically coupled to a corresponding signal contact of the first plurality of signal contacts. The second end of each conductors electrically coupled to a corresponding signal contact of the second plurality of signal contacts. The frame housing is configured to secure the one or more interposer blocks in a fixed location on the frame housing where the first end of each conductors exposed at a first major surface of the frame housing and the second end of each conductor is exposed at a second major surface of the frame housing. The frame housing is also configured to protect the compliant springs of each conductor from being over compressed when in contact with the first semiconductor device to the first end of each conductor.

In one aspect of the above embodiment, the frame housing includes a conductive material. In a further aspect, the frame housing includes a cavity that is electromagnetically shielded by the frame housing and one of the first and second semiconductor devices includes circuitry in a region of the semiconductor device that falls within the cavity when the semiconductor device is coupled to the interconnect system.

In another aspect of the above embodiment, the system further includes a first shroud structure coupled to the first major surface of the frame housing. The first shroud structure includes a plurality of openings. The first end of each conductor corresponds to and extends through an opening through the first shroud structure, and each opening is configured to restrict movement of each of the first end of the plurality of conductors to a single plane. In a further aspect, the first shroud structure is further configured to align the signal contacts of the first semiconductor device with the corresponding first ends of the plurality of conductors.

In another aspect of the above embodiment, the second end of each conductor forms a second compliant spring and the frame housing is configured to protect the second compliant spring from being over compressed when in contact with the corresponding signal contact of the second plurality of signal contacts. In another aspect of the above embodiment, the second end of each connector is soldered to a corresponding contact of the second plurality of signal contacts. In a further aspect, the second semiconductor device includes a testing circuitry configured to test circuitry in the first semiconductor device.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Although the invention is described herein with reference to specific embodiments, various modifications and changes can be made without departing from the scope of the present invention as set forth in the claims below. For example, a number of interposer structures incorporated into a frame structure can vary, or materials constructing frame structures and shroud structures can vary without departing from the scope of the invention. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An interconnect system comprising:
   one or more interposer blocks comprising a plurality of conductors, wherein
     each conductor comprises a first end and a second end, and
     the first end of each conductor forms a compliant spring; and
   a frame housing comprising a conductive material and configured to
     secure the one or more interposer blocks in a fixed location on the frame housing,
       the fixed location positioned in a socket area of the frame housing,
     wherein
       the first end of each conductor is exposed at a first major surface of the frame housing, and
       the second end of each conductor is exposed at a second major surface of the frame housing, and
     protect the compliant springs of each conductor from being over compressed when in contact with a first semiconductor device to the first end of each conductor;
     wherein the frame housing comprises a cavity located outside of the socket area and enclosed by a perimeter of the frame housing, the cavity being electromagnetically shielded by the frame housing, and the first semiconductor device comprises an electrical component in a region of the first semiconductor device that is to be positioned within the cavity when the first semiconductor device is coupled to the interconnect system.

2. The interconnect system of claim 1 further comprising a first shroud structure coupled to the first major surface of the frame housing, wherein the first shroud structure comprises a plurality of openings, the first end of each conductor corresponds to and extends through an opening through the first shroud structure, and each opening is configured to restrict movement of each of the first end of the plurality of conductors to a single plane.

3. The interconnect system of claim 2 wherein the first shroud structure is further configured to align signal contact elements of a first semiconductor device with a corresponding set of the first end of the plurality of conductors.

4. The interconnect system of claim 3 wherein the first shroud structure is further configured to prevent the corresponding set of the first end of the plurality of conductors from over compression due to contact with the signal contact elements.

5. The interconnect system of claim 2 wherein the first shroud structure is coupled to the frame housing in a region to protect conductors at the first major surface of the frame housing.

6. The interconnect system of claim 2 wherein the first shroud structure comprises an insulating material.

7. The interconnect system of claim 1 wherein the second end of each conductor forms a second compliant spring and the frame housing is configured to protect the second compliant spring from being over compressed when in contact with a second semiconductor device to the second end of each conductor.

8. The interconnect system of claim 7 further comprising: a first shroud structure coupled to the first major surface of the frame housing; and a second shroud structure coupled to the second major surface of the frame housing, wherein the first and second shroud structures both comprise a plurality of openings, the first end of each conductor corresponds to and extends through an opening through the first shroud structure, the second end of each conductor corresponds to and extends through an opening through the second shroud structure, each opening of the first shroud structure is configured to restrict movement of each of the first end of the plurality of conductors to a single corresponding plane, and each opening of the second shroud structure is configured to restrict movement of each of the second end of the plurality of conductors to the same corresponding plane as that of the first shroud structure.

9. The interconnect system of claim 1 wherein the second end of each connector is soldered to a second semiconductor device.

10. The interconnect system of claim 9 wherein the second semiconductor device comprises a testing device configured to test circuitry in the first semiconductor device.

11. A system comprising:
- a first semiconductor device comprising first circuitry electrically coupled to a first plurality of signal contacts;
- a second semiconductor device comprising second circuitry electrically coupled to a second plurality of signal contacts; and
- an interconnect system coupling the first and second semiconductor devices, the interconnect system comprising
  - one or more interposer blocks comprising a plurality of conductors, wherein
    - each conductor comprises a first end and a second end,
    - the first end of each conductor forms a compliant spring,
    - the first end of each conductor is electrically coupled to a corresponding signal contact of the first plurality of signal contacts,
    - the second end of each conductor is electrically coupled to a corresponding signal contact of the second plurality of signal contacts, and
  - a frame housing comprising a conductive material and configured to
    - secure the one or more interposer blocks in a fixed location on the frame housing, the fixed location positioned a socket area of the frame housing, wherein the first end of each conductor is exposed at a first major surface of the frame housing and the second end of each conductor is exposed at a second major surface of the frame housing, and
    - protect the compliant springs of each conductor from being over compressed when in contact with the first semiconductor device to the first end of each conductor;
  - wherein the frame housing comprises a cavity located outside of the socket area and enclosed by a perimeter of the frame housing, the cavity being electromagnetically shielded by the frame housing, and one of the first and second semiconductor devices comprises an electrical component in a region of the semiconductor device that is to be positioned within the cavity when the semiconductor device is coupled to the interconnect system.

12. The system of claim 11 further comprising: a first shroud structure coupled to the first major surface of the frame housing, wherein the first shroud structure comprises a plurality of openings, the first end of each conductor corresponds to and extends through an opening through the first shroud structure, and each opening is configured to restrict movement of each of the first end of the plurality of conductors to a single plane.

13. The system of claim 12 wherein the first shroud structure is further configured to align the signal contacts of the first semiconductor device with the corresponding first ends of the plurality of conductors.

14. The system of claim 11 wherein the second end of each conductor forms a second compliant spring and the frame housing is configured to protect the second compliant spring from being over compressed when in contact with the corresponding signal contact of the second plurality of signal contacts.

15. The system of claim 11 wherein the second end of each connector is soldered to a corresponding contact of the second plurality of signal contacts.

16. The system of claim 15 wherein the second semiconductor device comprises a testing circuitry configured to test circuitry in the first semiconductor device.

* * * * *